(12) United States Patent
Nanjappan

(10) Patent No.: US 11,029,810 B2
(45) Date of Patent: Jun. 8, 2021

(54) EQUIPMENT SERVICE GRAPHICAL INTERFACE

(71) Applicant: Otis Elevator Company, Farmington, CT (US)

(72) Inventor: Ezhil Nanjappan, Farmington, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 246 days.

(21) Appl. No.: 15/992,714

(22) Filed: May 30, 2018

(65) Prior Publication Data

US 2019/0339841 A1 Nov. 7, 2019

Related U.S. Application Data

(60) Provisional application No. 62/668,026, filed on May 7, 2018.

(51) Int. Cl.
*G06F 15/177* (2006.01)
*G06F 3/0481* (2013.01)
(Continued)

(52) U.S. Cl.
CPC ........ *G06F 3/04817* (2013.01); *B66B 5/0006* (2013.01); *B66B 5/0037* (2013.01);
(Continued)

(58) Field of Classification Search
CPC .................. B66B 1/3461; B66B 1/468; B66B 2201/4615; B66B 2201/4653;
(Continued)

(56) References Cited

U.S. PATENT DOCUMENTS 4,930,604 A * 6/1990 Schienda .............. B66B 5/0006
187/393
6,304,257 B1 * 10/2001 Viskari ................. B66B 5/0006
187/241
(Continued)

FOREIGN PATENT DOCUMENTS

CN 107187982 A 9/2017
EP 2336070 A1 6/2011
(Continued)

OTHER PUBLICATIONS

EP Application No. 19173157.9 Extended EP Search Report dated Oct. 11, 2019, 55 pages.
(Continued)

*Primary Examiner* — Jennifer E Nichols
(74) *Attorney, Agent, or Firm* — Cantor Colburn LLP

(57) ABSTRACT

An equipment service graphical interface is provided. An entity and an entity location of a plurality of equipment are identified. A data repository is accessed that includes a plurality of equipment servicing data associated with the equipment at the entity location. A map image is output on a graphical user interface including one or more icons indicating one or more equipment locations and status of the equipment based on the equipment servicing data from the data repository. One or more equipment status details are selectively displayed on the graphical user interface responsive to a detected user input action.

18 Claims, 11 Drawing Sheets

(51) Int. Cl.
*B66B 5/00* (2006.01)
*G06F 3/0482* (2013.01)
*H04W 4/021* (2018.01)
*G06F 3/0488* (2013.01)
*G06F 16/00* (2019.01)
*H04W 4/029* (2018.01)
*G06F 3/01* (2006.01)
*G06F 30/00* (2020.01)
*G06F 30/13* (2020.01)
*B66B 25/00* (2006.01)
*B66B 1/34* (2006.01)

(52) U.S. Cl.
CPC ............ *G06F 3/017* (2013.01); *G06F 3/0482* (2013.01); *G06F 3/0488* (2013.01); *G06F 16/00* (2019.01); *G06F 30/00* (2020.01); *G06F 30/13* (2020.01); *H04W 4/021* (2013.01); *H04W 4/029* (2018.02); *B66B 1/3423* (2013.01); *B66B 1/3461* (2013.01); *B66B 25/006* (2013.01); *G06F 2203/04806* (2013.01)

(58) Field of Classification Search
CPC .... B66B 2201/4661; B66B 2201/4676; B66B 25/00; B66B 5/0006; B66B 5/0037; B66B 1/3423; B66B 5/0018; B66B 2201/406; B66B 2201/403; B66B 25/006; G06F 3/017; G06F 3/0488; G06F 11/30; G06F 11/3051; G06F 11/3058; G06F 11/32; G06F 16/9024; G06F 16/29; G06F 3/04817; G06F 2203/04806; G06F 3/04842; G06F 30/00; G06F 2111/20; G06F 30/13; G06F 3/0482; G06F 9/451; G06F 16/00; H04W 4/029; H04W 4/026; H04W 4/021; Y04S 20/227; H04L 12/2823; G06T 2200/24; G06T 15/00; G06T 17/00; G06T 19/00; G06T 2215/16
See application file for complete search history.

(56) References Cited

U.S. PATENT DOCUMENTS

| | | |
|---|---|---|
| 6,882,307 B1 | 4/2005 | Gifford |
| 6,998,995 B2 | 2/2006 | Nakajima |
| 7,002,462 B2 | 2/2006 | Welch |
| 7,073,633 B2 | 7/2006 | Weinberger et al. |
| 7,143,007 B2 | 11/2006 | Long et al. |
| 7,194,415 B2 | 3/2007 | Hamada |
| 7,249,250 B1* | 7/2007 | Akasaka ............ G06F 30/13 713/1 |
| 7,398,860 B2 | 7/2008 | Amano |
| 7,793,762 B2* | 9/2010 | Zaharia .............. B66B 1/462 187/396 |
| 7,965,178 B1 | 6/2011 | Schmuttor et al. |
| 8,358,903 B1* | 1/2013 | Meads ............. H04N 21/41407 386/200 |
| 8,618,935 B2 | 12/2013 | Felt et al. |
| 8,649,987 B2 | 2/2014 | Steenberg et al. |
| 8,706,414 B2 | 4/2014 | Funk et al. |
| 8,712,686 B2 | 4/2014 | Bandyopadhyay et al. |
| 8,838,504 B2 | 9/2014 | Eraker et al. |
| 9,223,313 B2 | 12/2015 | Wolfe et al. |
| 9,318,078 B2* | 4/2016 | McIntyre ............. G09G 5/373 |
| 9,342,223 B2* | 5/2016 | Dharmalingam ... G06F 3/04815 |
| 9,382,097 B2* | 7/2016 | Nagata .................. B66B 3/006 |
| 9,417,777 B2 | 8/2016 | Pensack-Rinehart et al. |
| 9,525,976 B2* | 12/2016 | Dharwada ............ H04W 4/20 |
| 9,767,441 B2 | 9/2017 | Eleid et al. |
| 10,139,792 B2* | 11/2018 | Schmitt ............... G05B 15/02 |
| D858,548 S * | 9/2019 | Senger ..................... D14/486 |
| 10,733,333 B2* | 8/2020 | Chen ..................... G06F 30/13 |
| 10,753,762 B2* | 8/2020 | Shelby ................ G01C 21/3415 |
| 2002/0099460 A1* | 7/2002 | Bowler .................. G06F 30/13 700/97 |
| 2002/0173970 A1* | 11/2002 | Hamada ................. G06Q 10/10 705/305 |
| 2003/0057029 A1* | 3/2003 | Fujino ..................... B66B 3/008 187/391 |
| 2004/0088115 A1* | 5/2004 | Guggari ................. G06Q 10/06 702/13 |
| 2005/0004945 A1* | 1/2005 | Cossins .................... H04L 67/36 |
| 2006/0197781 A1 | 9/2006 | Arutunian |
| 2007/0097419 A1* | 5/2007 | Mathewson ........... G03G 15/502 358/1.15 |
| 2007/0219645 A1* | 9/2007 | Thomas ................. G05B 15/02 700/29 |
| 2007/0250199 A1* | 10/2007 | Akasaka ................. G06Q 10/087 700/97 |
| 2007/0268300 A1 | 11/2007 | (Janet) et al. |
| 2008/0159494 A1* | 7/2008 | Quinlan ................. F25D 29/008 379/90.01 |
| 2009/0216438 A1 | 8/2009 | Shafer |
| 2011/0190952 A1 | 8/2011 | Goldstein |
| 2011/0288895 A1* | 11/2011 | Perez, Jr. ............ G06Q 50/163 705/7.12 |
| 2011/0316884 A1* | 12/2011 | Giambalvo ............. G06F 16/44 345/660 |
| 2012/0320058 A1 | 12/2012 | Stephen |
| 2013/0080504 A1* | 3/2013 | Maurer .................... G06T 17/05 709/203 |
| 2013/0083012 A1* | 4/2013 | Han ........................ G05B 23/027 345/419 |
| 2013/0222373 A1* | 8/2013 | Weinstein ............. G06F 16/248 345/419 |
| 2013/0290899 A1* | 10/2013 | Amran ................... G03G 15/553 715/810 |
| 2014/0005809 A1* | 1/2014 | Frei ....................... G06F 13/10 700/90 |
| 2014/0142895 A1* | 5/2014 | Sharma ................ G09B 29/004 703/1 |
| 2014/0229426 A1* | 8/2014 | Gootee, III ............. G06F 30/13 707/608 |
| 2014/0262628 A1* | 9/2014 | Jacobs .................. B66B 1/2466 187/247 |
| 2014/0282215 A1* | 9/2014 | Grubbs ............... G06F 3/04817 715/781 |
| 2014/0359510 A1* | 12/2014 | Graf .................... G01C 21/3614 715/771 |
| 2015/0274486 A1* | 10/2015 | Wilke .................. B66B 5/0018 187/391 |
| 2015/0284214 A1* | 10/2015 | Park ..................... B66B 5/0037 187/393 |
| 2015/0327010 A1* | 11/2015 | Gottschalk ............ H04W 4/021 455/456.1 |
| 2016/0069584 A1* | 3/2016 | Holaso .................... F24F 11/30 700/276 |
| 2016/0148422 A1* | 5/2016 | Direkwut ............. G01C 21/383 345/420 |
| 2017/0029244 A1 | 2/2017 | Madarasz et al. |
| 2017/0060383 A1* | 3/2017 | Gomez ................. H04W 64/00 |
| 2017/0190543 A1* | 7/2017 | Friedli ................ H04L 41/0809 |
| 2017/0201428 A1* | 7/2017 | Normandin ............ G06F 7/08 |
| 2017/0313546 A1* | 11/2017 | King .................... B66B 1/2491 |
| 2017/0314803 A1* | 11/2017 | Jacobson ................. F24F 11/52 |
| 2018/0150806 A1* | 5/2018 | Eleid ..................... G06Q 10/20 |
| 2019/0156443 A1* | 5/2019 | Hall ...................... H04L 67/02 |
| 2019/0303451 A1* | 10/2019 | Takahashi ............... G06F 16/20 |

FOREIGN PATENT DOCUMENTS

| | | |
|---|---|---|
| EP | 3159659 A1 | 4/2017 |
| EP | 3409630 A1 | 12/2018 |
| JP | 2002230196 A | 8/2002 |
| JP | 2003067877 A | 3/2003 |

(56) References Cited

FOREIGN PATENT DOCUMENTS

| JP | 2014002624 A | 1/2014 |
|---|---|---|
| WO | 2007055286 A1 | 5/2007 |

OTHER PUBLICATIONS

ESRI, "GIS in Education: Across Campuses, Inside Facilities", Aug. 2012, Accessed on May 17, 2018 at http://www.esri.com/library/ebooks/gis-in-education-facilities.pdf (58 pp.)

Kone E-Link, Elevator and Escalator Monitoring and Command System, Accessed on May 17, 2018 at https://www.kone.us/Images/kone-e-link-elevator-escalator-monitoring-and-command_tcm25-18819.pdf (8 pp.)

LifeNet Monitoring, "State of the Art Monitoring for Elevators, Escaltors, Moving Walkways, and More", Accessed on May 15, 2018 at https://www.liftnet.com (3 pp.)

Powerhouse Dynamics, "SiteSage Assets: Equipment Asset Management with SiteSage Assets", Accessed on May 15, 2018 at https://powerhousedynamics.com/solutions/sitesage/sitesage-assets/ (5 pp.)

\* cited by examiner

EQUIPMENT SERVICE GRAPHICAL INTERFACE

CROSS-REFERENCE TO RELATED APPLICATION

This application claims the benefit of priority to U.S. Provisional Application No. 62/668,026 filed May 7, 2018, the disclosure of which is incorporated herein by reference in its entirety.

BACKGROUND

The present disclosure relates to equipment service systems, and more particularly, to an equipment service graphical interface.

Equipment system operators may oversee multiple equipment systems at one or more geographic locations. Equipment systems can include many components with varying maintenance schedules, expected service lives, and component ages. Overseeing equipment system servicing can be challenging due to the large volume of data, geographical distribution of equipment, and variations in equipment characteristics installed at one or more locations.

BRIEF DESCRIPTION

According to some embodiments, a method includes identifying an entity and an entity location of a plurality of equipment. A data repository is accessed that includes a plurality of equipment servicing data associated with the equipment at the entity location. A map image is output on a graphical user interface including one or more icons indicating one or more equipment locations and status of the equipment based on the equipment servicing data from the data repository. One or more equipment status details are selectively displayed on the graphical user interface responsive to a detected user input action.

In addition to one or more of the features described above or below, or as an alternative, further embodiments may include where the detected user input action includes a hovering action over at least one of the one or more icons, and the one or more equipment status details are associated with a specific instance of the equipment at the entity location depicted on the map image.

In addition to one or more of the features described above or below, or as an alternative, further embodiments may include where one or more display characteristics of the one or more icons vary based on the status of the equipment indicative of one or more differences in operational conditions of the equipment.

In addition to one or more of the features described above or below, or as an alternative, further embodiments may include outputting a health score on the graphical user interface that summarizes a plurality of conditions of the equipment at the one or more equipment locations displayed on the graphical user interface.

In addition to one or more of the features described above or below, or as an alternative, further embodiments may include outputting an uptime indicator on the graphical user interface that summarizes a performance history of the equipment at the one or more equipment locations displayed on the graphical user interface for a first predetermined period of time.

In addition to one or more of the features described above or below, or as an alternative, further embodiments may include outputting an activity history on the graphical user interface that summarizes a total number of visits, scheduled visits, predictive maintenance events, and service requests for the equipment at the one or more equipment locations displayed on the graphical user interface for a second predetermined period of time.

In addition to one or more of the features described above or below, or as an alternative, further embodiments may include outputting a unit summary on the graphical user interface of a plurality of units of the equipment at the one or more equipment locations displayed on the graphical user interface, where each of the units includes an elevator system.

In addition to one or more of the features described above or below, or as an alternative, further embodiments may include updating the graphical user interface with a plurality of unit status details based on detecting a unit selection from the plurality of units, and replacing the map image on the graphical user interface with a schematic view of a plurality of components of the elevator system including the unit selection.

In addition to one or more of the features described above or below, or as an alternative, further embodiments may include where the unit status details include the health score for the unit selected, the activity history for the unit selected, and one or more time history plots for the unit selected.

In addition to one or more of the features described above or below, or as an alternative, further embodiments may include detecting a change in a zoom level of the map image on the graphical user interface, identifying a plurality of entity locations of the entity within a geographic area displayed on the map image, retrieving the equipment servicing data associated with the equipment at the plurality of entity locations from the data repository, updating the map image on the graphical user interface with a plurality of icons indicative of the status of the equipment at the plurality of entity locations, determining an update to a plurality of summary data associated with the equipment at the plurality of entity locations, and updating one or more values displayed on the graphical user interface with the update to the summary data.

According to some embodiments, a system includes a processing system, a user interface driver, and a memory system. The user interface driver is operable to output a graphical user interface and receive input through the graphical user interface. The memory system includes a plurality of instructions stored thereon that, when executed by the processing system, cause the system to perform a plurality of operations. The operations include identifying an entity and an entity location of a plurality of equipment. A data repository is accessed that includes a plurality of equipment servicing data associated with the equipment at the entity location. A map image is output on the graphical user interface including one or more icons indicating one or more equipment locations and status of the equipment based on the equipment servicing data from the data repository. One or more equipment status details are selectively displayed on the graphical user interface responsive to a detected user input action.

Technical effects of embodiments of the present disclosure include providing an equipment service graphical interface with a graphical user interface operable to selectively display equipment status details and resizable map images with icons indicating one or more equipment locations and status. The equipment service graphical interface can access a data repository and provide summarized results to reduce network traffic with respect to multiple monitoring access systems.

The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

A detailed description of one or more embodiments of the disclosed apparatus and method are presented herein by way of exemplification and not limitation with reference to the Figures.

Figure 1:
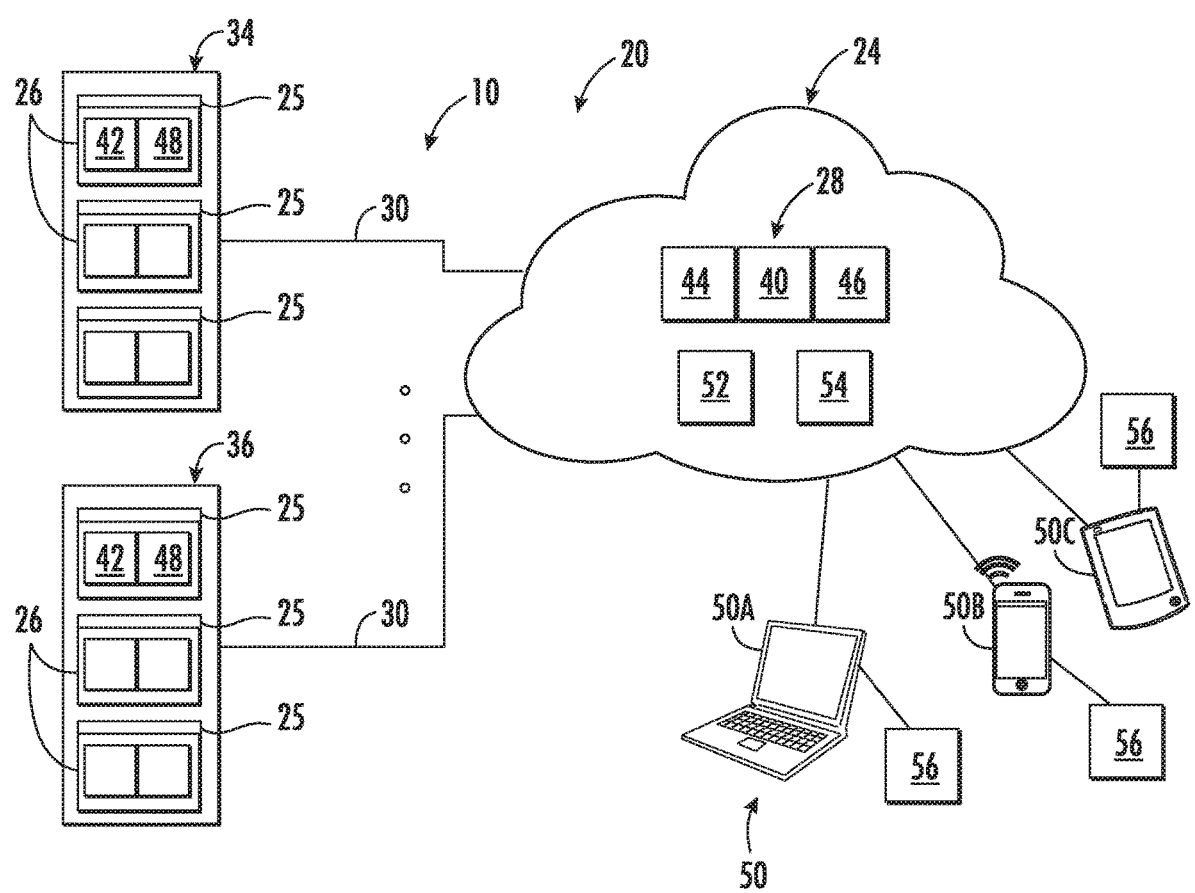
FIG. 1 is a schematic illustration of an equipment service system according to a, non-limiting, exemplary embodiment of the present disclosure.

Referring to FIG. 1, an exemplary embodiment of an equipment service system 20 including a data collection system 24 is depicted for collecting equipment servicing data for a plurality of equipment 10. The equipment 10 can include one or more units 25 with one or more equipment controllers 26 operable to monitor and control the units 25 at one or more entity locations. Each of the units 25 can be, for example, an elevator system, where an entity location may include multiple elevator systems (e.g., multiple single elevator car systems or multi-car elevator banks) within a same physical structure, such as a building or parking garage, or may be a campus location with multiple structures including the units 25. An entity, such as company or property management group, may oversee multiple locations, such as locations 34, 36, that each includes multiple units 25 and equipment controllers 26. The equipment controllers 26 may each include respective processors 42 (e.g., microprocessors), and storage mediums 48 that may be computer writeable and readable for controlling and monitoring operations of the units 25. The equipment controllers 26 may establish communication through one or more communication pathways 30 with the data collection system 24. The communication pathways 30 may be associated with such communication protocols as Bluetooth®, Wi-Fi, infrared, mobile broadband (e.g., 3G, 4G, etc.), satellite, and others over wired, wireless, and/or optical connections. The data collection system 24 may be cloud-based (i.e., in a cloud network environment). In one embodiment, the data collection system may be local to locations 34, 36, controllers 26, and/or units 25 and may transmit the collected data along the communication pathways to a remote computer system, such as the cloud, equipment service graphical interface 56, monitoring access systems 50, or some other device.

The equipment service system 20 can also include one or more monitoring access systems 50 operable to interface with the data collection system 24 to retrieve equipment servicing data associated with the equipment 10. The monitoring access systems 50 can include, for example, one or more laptop computers 50A, smartphones 50B, tablet computers 50C, and/or other electronic devices. The data collection system 24 can include a system 28 operable to provide an equipment service graphical interface 56 including a plurality of graphical user interfaces to the monitoring access systems 50 for interactively viewing and analyzing equipment servicing data associated with the equipment 10. The system 28 can be distributed over one or more computer systems that form the data collection system 24, for instance, as one or more cloud-based/networked computer systems. In the example of FIG. 1, the system 28 includes a processing system 40, a user interface driver 44, and a memory system 46. The user interface driver 44 is operable to output one or more graphical user interfaces for one or more of the monitoring access systems 50 and receive input through graphical user interfaces from one or more monitoring access systems 50. For instance, a keypad, a touchscreen, a pointer device, or other such input device of the one or more monitoring access systems 50 collects user input for further processing by the system 28. The memory system 46 includes a plurality of instructions stored thereon that, when executed by the processing system 40, cause the system 28 to perform a plurality of operations. The processing system 40 may be but is not limited to a single-processor or multi-processor system of any of a wide array of possible architectures, including field programmable gate array (FPGA), central processing unit (CPU), application specific integrated circuits (ASIC), digital signal processor (DSP) or graphics processing unit (GPU) hardware arranged homogenously or heterogeneously. The memory system 46 may include one or more storage devices such as, for example, a random access memory (RAM), read only memory (ROM), or other electronic, optical, magnetic or any other computer readable storage medium.

In embodiments, equipment servicing data associated with the equipment 10 is stored in a data repository 52, which may be part of the data collection system 24. The data repository 52 is accessible by the system 28 and supports filtering and summarizing actions for the one or more monitoring access systems 50. In embodiments, the equipment controllers 26, the system 28, or other elements run diagnostics and monitor the performance of the units 25, with the results being stored as equipment servicing data associated with the equipment 10 in the data repository 52. The system 28 selectively provides data summarizing the equipment servicing data as needed/requested through the monitoring access systems 50. The equipment controllers 26 or other elements can push the equipment servicing data to the data repository 52 as events are observed associated with the units 25. The data repository 52 can collect data for many instances of the equipment 10 that may not be relevant to a particular user of the monitoring access systems 50. The system 28 can filter the equipment servicing data selected for summarizing and reporting to the monitoring access systems 50 to ensure that relevant data values are reported. The system 28 may also interface with a mapping system 54 operable to provide one or more map images for displaying and overlaying of icons indicative of the status of the equipment 10 at the plurality of entity locations 34, 36. The memory system 46 can include instructions operable to produce the equipment service graphical interface 56 for interactive display on the monitoring access systems 50, including a plurality of graphical user interfaces as further described herein with respect to FIGS. 2-10.

Figure 2:
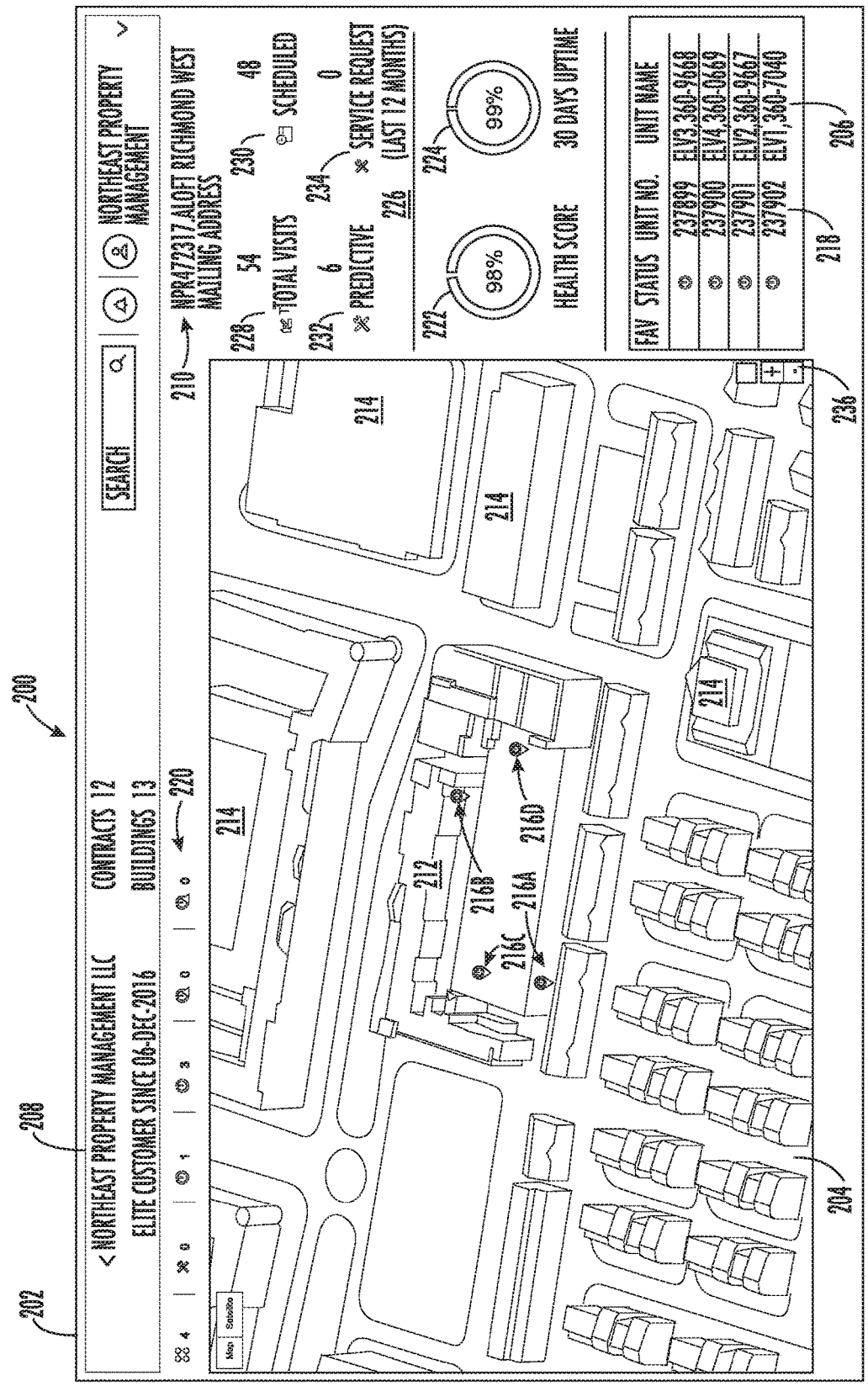
FIG. 2 depicts a graphical user interface in accordance with an embodiment of the present disclosure.

FIG. 2 depicts an example of a graphical user interface 200 of the equipment service graphical interface 56 of FIG. 1 that can be generated by the system 28 for the monitoring access systems 50 of FIG. 1. The graphical user interface 200 can include an information bar 202, a map image 204, a status data panel 206, an entity 208, and an entity location 210. In the example of FIG. 2, the information bar 202 can include a variety of high-level information, such as a name of the entity 208, a number of buildings managed by the entity 208, a number of maintenance contracts with the entity 208, and other such information. Further, the information bar 202 can support search operations, alerts, and provide other information associated with the entity 208. The map image 204 can graphically depict a plurality of structures, such as one or more structures 212 that include equipment 10 of FIG. 1 managed by the entity 208 and one or more structures 214 that do not include equipment 10 of FIG. 1 managed by the entity 208. In the example of FIG. 2, the entity location 210 includes equipment 10 (FIG. 1) at multiple equipment locations 216A, 216B, 216C, 216D as depicted graphically as one or more icons (e.g., pins) that overlay the map image 204.

Further details about the equipment 10 may be provided on the status data panel 206 including unit specific information 218, such as a unit specific health status, a unit identifier number, and a unit name. The unit specific health status for each unit 25 (FIG. 1) of the equipment 10 at the equipment locations 216A-216D can also be graphically depicted as an icon to summarize the condition of each unit 25. The display characteristics of the one or more icons can vary based on the status of the equipment 10 indicative of one or more differences in operational conditions of the equipment 10. For instance, an "In-Service" indicator may be green while a "Shutdown" indicator may be red. Further icons that may be displayed depending on the operating conditions can include a "Trending Sick" indicator, a "Needs Attention" indicator, an "Open Service Request" indicator, and other such indicators. Status and condition of the equipment 10 presently visible on the map image 204 can be summarized on a status summary bar 220. For instance, in the example of FIG. 2, the status summary bar 220 indicates that four units 25 include one unit 25 having a status of "Shutdown" (at equipment location 216A), three units 25 having a status of "In-Service" (at equipment locations 216B, 216C, 216D), and no units 25 having a status of "Open Service Request", "Trending Sick", or "Needs Attention".

The status data panel 206 may also include a health score 222 on the graphical user interface 200 that summarizes a plurality of conditions of the equipment 10 at the one or more equipment locations 216A-216D displayed on the graphical user interface 200. The health score 222 may represent an average health status of the equipment at the entity location 210 (e.g., one or more structures 212 that include equipment 10) over a predetermined period of time. For instance, if one of the units 25 at equipment location 216A was in a Needs Attention state for two days out of thirty days while units 25 at equipment locations 216B-216D remained In-Service for the same period of thirty days, then the resulting health score 222 may indicate 98% (126 healthy unit days/128 total unit days). In some embodiments, the period of time for computing the health score 222 is configurable. In one embodiment, the health score 222 is an instantaneous reading of the health of the units 25.

The status data panel 206 may also include an uptime indicator 224 on the graphical user interface 200 that summarizes a performance history of the equipment 10 at the one or more equipment locations 216A-216D displayed on the graphical user interface 200 for a predetermined period of time, such as thirty days. In one embodiment, the predetermined period of time may be greater than or less than thirty days. The uptime indicator 224 may represent an average uptime status of the equipment at the entity location 210 (e.g., one or more structures 212 that includes equipment 10) over the predetermined period of time. For instance, if one of the units 25 at equipment location 216A was in a Shutdown state for one day out of thirty days while units 25 at equipment locations 216B-216D remained In-Service for the same period of thirty days, then the resulting uptime indicator 224 may indicate 99% (127 active unit days/128 total unit days). In some embodiments, the period of time for computing the uptime indicator 224 is configurable. The uptime indicator 224 may be a higher score than the health score 222 if the equipment 10 was operational but encountered one or more events that resulted in degraded operation, for example.

The status data panel 206 may also include an activity history 226 on the graphical user interface 200 that summarizes a total number of visits 228, scheduled visits 230, predictive maintenance events 232, and service requests 234 for the equipment 10 at the one or more equipment locations 216A-216D displayed on the graphical user interface 200 for a predetermined period of time. Total visits 228 may be indicative of a total number of service visits by a mechanic in a predetermined period of time. Scheduled visits 230 may be indicative of a total number of scheduled service visits (i.e., regularly scheduled maintenance appointments) by a mechanic in a predetermined period of time. Predictive visits 232 may be indicative of a total number of service visits made as a result of sensor data indicating a component had not yet failed but was in need of maintenance in a predetermined period of time. Service requests 234 may be indicative of a total number of service requests made by the customer/building owner in a predetermined period of time. The predictive maintenance events 232 can be flagged, for example, by one or more equipment controllers 26 (FIG. 1) or other diagnostic/prognostic systems of the equipment service system 20 (FIG. 1), for instance, using trending of sensor data for the equipment 10 and/or other techniques known in the art. The predetermined period of time for the activity history 226 may differ from the predetermined period of time for the health score 222 and/or the uptime indicator 224 (e.g., twelve months versus thirty days). In some embodiments, the period of time for computing the activity history 226 is configurable. Although a number of specific examples of status and summarized data are depicted in the example of FIG. 2, it will be understood that variations include other indicators or fewer indicators are contemplated.

In some embodiments, the map image 204 is interactive and supports panning, zooming, rotation, and/or other actions through map controls 236 and/or through point/click actions, keyboard commands, or touchscreen gestures. As a field of view of the map image 204 is adjusted, the values of the status data panel 206 can be dynamically adjusted depending on whether one or more structures 212 that include equipment 10 of FIG. 1 managed by the entity 208 are visible on the map image 204. For instance, user requested changes to the zoom level or viewable area of the map image 204 may result in the system 28 (FIG. 1) querying the mapping system 54 for updates to the map image 204 and querying the data repository 52 to retrieve an updated data set corresponding with any equipment locations 216A-216D having positions that are within a viewable area of the map image 204. In some embodiments, the system 28 can buffer data for a larger area than is presently visible on the map image 204 to enable smoother panning or other display adjustments.

Figure 3:
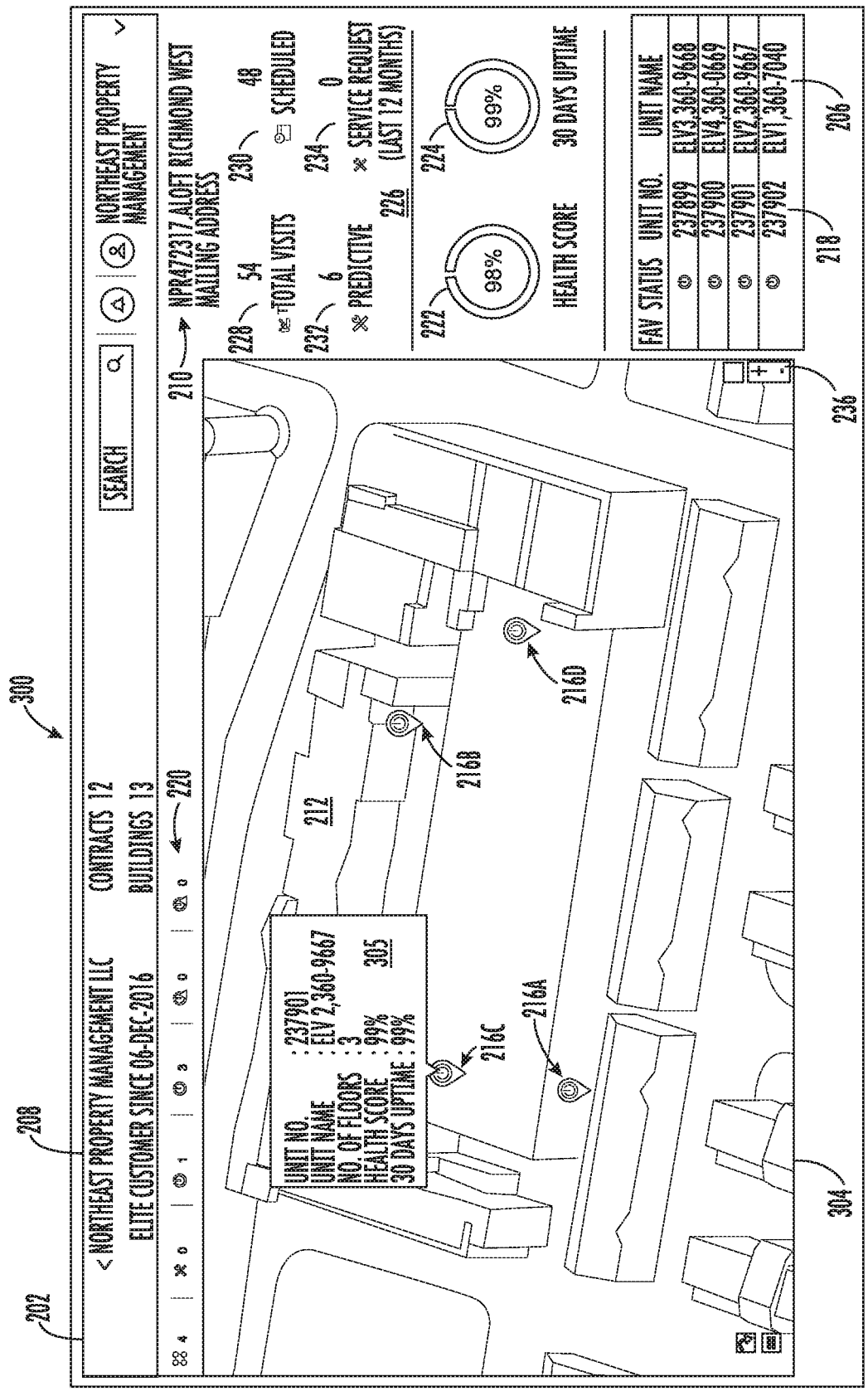
FIG. 3 depicts a graphical user interface in accordance with an embodiment of the present disclosure.

FIG. 3 depicts an example of a graphical user interface 300 of the equipment service graphical interface 56 of FIG. 1 that can be generated by the system 28 for the monitoring access systems 50 of FIG. 1. The graphical user interface 300 includes the same information bar 202, status data panel 206, entity 208, entity location 210, one or more structures 212 that include equipment 10 of FIG. 1 managed by the entity 208, equipment locations 216A-216D, unit specific information 218, status summary bar 220, health score 222, uptime indicator 224, and activity history 226 as previously described with respect to FIG. 2. A map image 304 of FIG. 3 is a zoomed-in view of the map image 204 of FIG. 2 (e.g., as selected through the map controls 236). The map image 304 also depicts a pop-up summary 305 of one or more equipment status details associated with a specific instance of the equipment 10 at the entity location 210. In the example of FIG. 3, the pop-up summary 305 is associated with the unit 25 (FIG. 1) at equipment location 216C. The pop-up summary 305 can include information such as a unit identifier number, a unit name, a number of floors/landings (e.g., when embodied as an elevator system), a unit-specific health score, a unit-specific uptime, and/or other data. The system 28 can output the pop-up summary 305 based on a detected user input action, such as a hovering action over at least one of the one or more icons on the map image 304.

Figure 4:
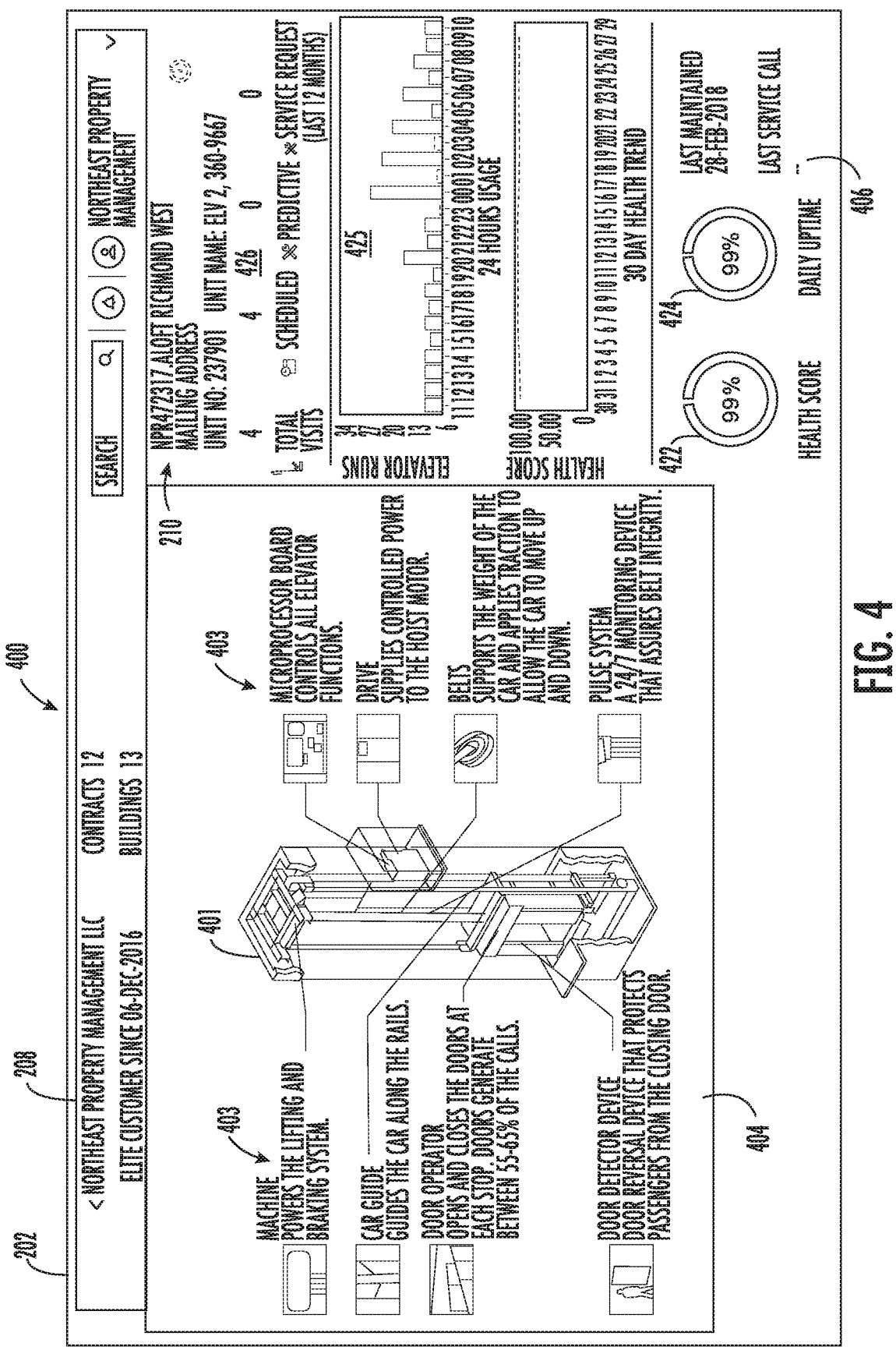
FIG. 4 depicts a graphical user interface in accordance with an embodiment of the present disclosure.

FIG. 4 depicts an example of a graphical user interface 400 of the equipment service graphical interface 56 of FIG. 1 that can be generated by the system 28 for the monitoring access systems 50 of FIG. 1. The graphical user interface 400 is an example of updating the graphical user interface 300 of FIG. 3 with a plurality of unit status details based on detecting a unit selection from the plurality of units 25 (FIG. 1). The graphical user interface 400 includes the same information bar 202, entity 208, and entity location 210 as in FIGS. 2 and 3; however, other unit-specific details are displayed. For example, an action or gesture associated with the unit 25 at equipment location 216C of FIGS. 2-3, which was summarized by the pop-up summary 305 of FIG. 3, may trigger a more detailed view of the unit 25. For instance, the system 28 may replace the map image 304 on the graphical user interface 300 of FIG. 3 with a schematic view 404 of a plurality of components 403 of an elevator system 401 comprising the unit selection in graphical user interface 400. Components 403 can include names, operational summaries, and approximate placement information with respect to a specific model of the elevator system 401 at the selected location. In the context of elevators, the components 403 may include a machine, a car guide, a door operator, a door detection device, a microprocessor board, a drive, belts, a monitoring system, and/or other elements. The system 28 may also display the unit status details 406, such as a health score 422 and uptime 424 for the unit selected, an activity history 426 for the unit selected, and one or more time history plots 425 for the unit selected.

Figure 5:
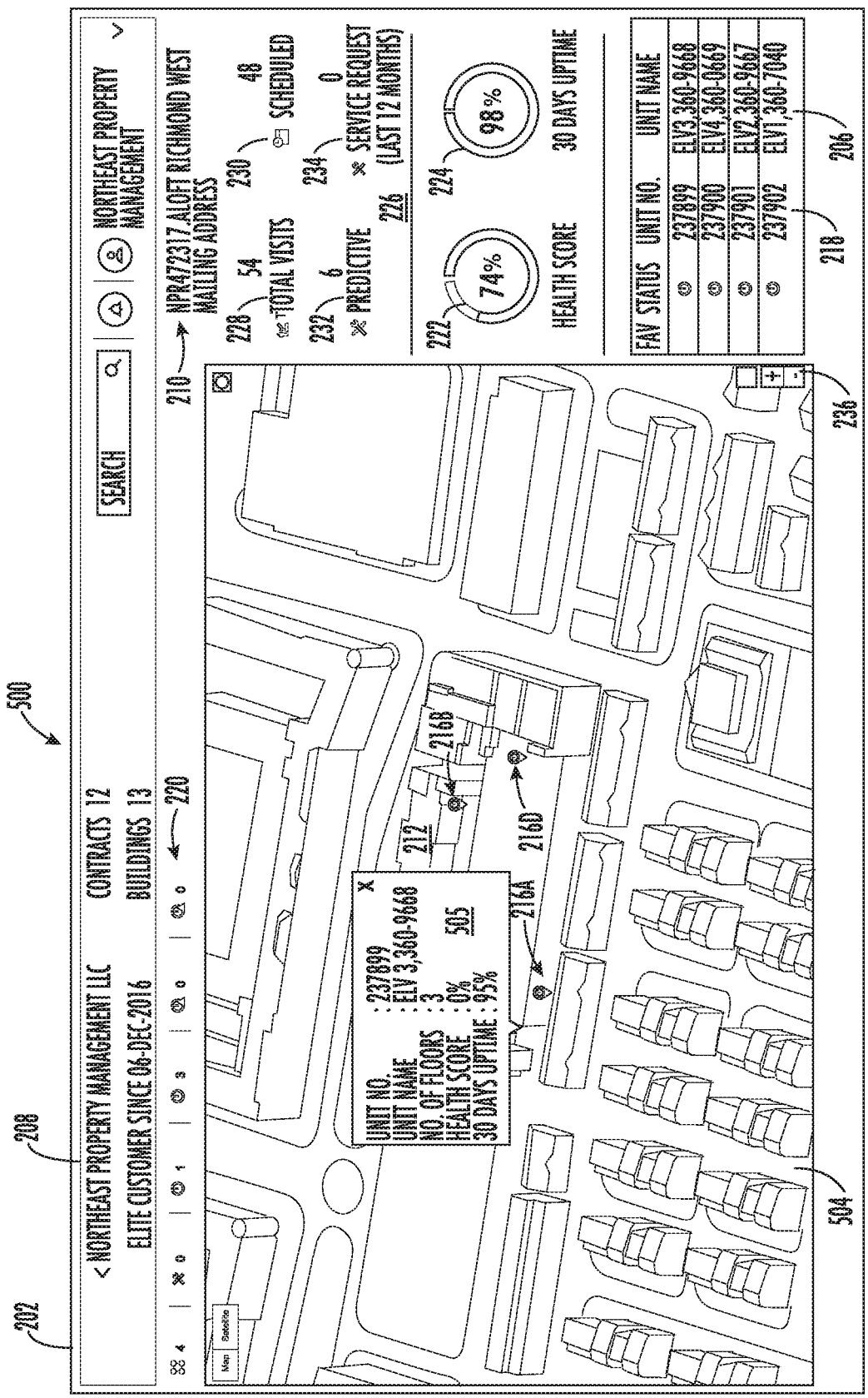
FIG. 5 depicts a graphical user interface in accordance with an embodiment of the present disclosure.

FIG. 5 depicts an example of a graphical user interface 500 of the equipment service graphical interface 56 of FIG. 1 that can be generated by the system 28 for the monitoring access systems 50 of FIG. 1. The graphical user interface 500 includes the same information bar 202, status data panel 206, entity 208, entity location 210, one or more structures 212 that include equipment 10 of FIG. 1 managed by the entity 208, equipment locations 216A-216D, unit specific information 218, status summary bar 220, health score 222, uptime indicator 224, and activity history 226 as previously described with respect to FIG. 2. A map image 504 of FIG. 5 is similar to the map image 204 of FIG. 2; however, the map image 504 also depicts a pop-up summary 505 of one or more equipment status details associated with a specific instance of the equipment 10 at the entity location 210. In the example of FIG. 5, the pop-up summary 505 is associated with the unit 25 (FIG. 1) at equipment location 216A. The pop-up summary 505 can include information such as a unit identifier number, a unit name, a number of floors/landings (e.g., when embodied as an elevator system), a unit-specific health score, a unit-specific uptime, and/or other data. The system 28 can output the pop-up summary 505 based on a detected user input action, such as a hovering action over at least one of the one or more icons on the map image 504. Notably, the pop-up summary 505 is an example for a unit 25 in an unhealthy/shutdown state.

Figure 6:
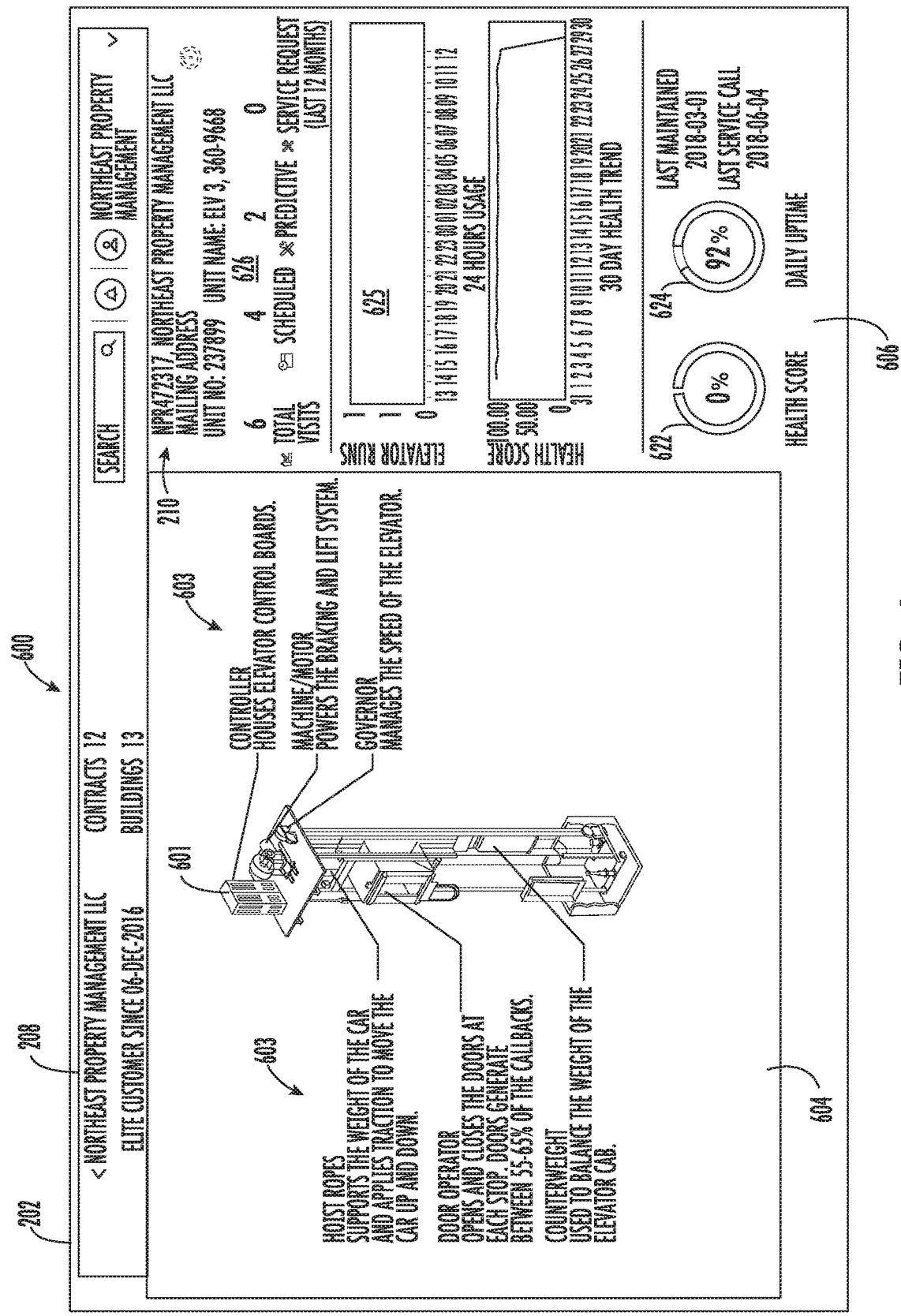
FIG. 6 depicts a graphical user interface in accordance with an embodiment of the present disclosure.

FIG. 6 depicts an example of a graphical user interface 600 of the equipment service graphical interface 56 of FIG. 1 that can be generated by the system 28 for the monitoring access systems 50 of FIG. 1. The graphical user interface 600 is an example of updating the graphical user interface 500 of FIG. 5 with a plurality of unit status details based on detecting a unit selection from the plurality of units 25 (FIG. 1). The graphical user interface 600 includes the same information bar 202, entity 208, and entity location 210 as in FIGS. 2-5; however, other unit-specific details are displayed. For example, an action or gesture associated with the unit 25 at equipment location 216A of FIG. 5, which was summarized by the pop-up summary 505 of FIG. 5, may trigger a more detailed view of the unit 25. For instance, the system 28 may replace the map image 504 on the graphical user interface 500 of FIG. 5 with a schematic view 604 of a plurality of components 603 of an elevator system 601 comprising the unit selection in graphical user interface 600. Notably the configuration of the elevator system 601 differs from the configuration of the elevator system 401 of FIG. 4. Components 603 can include names, operational summaries, and approximate placement information with respect to a specific model of the elevator system 601 at the selected location. In the context of elevators, the components 603 may include hoist ropes, a door operator, a counterweight, a controller, a machine/motor, a governor, and/or other elements. The system 28 may also display the unit status details 606, such as a health score 622 and uptime 624 for the unit selected, an activity history 626 for the unit selected, and one or more time history plots 625 for the unit selected.

Figure 7:
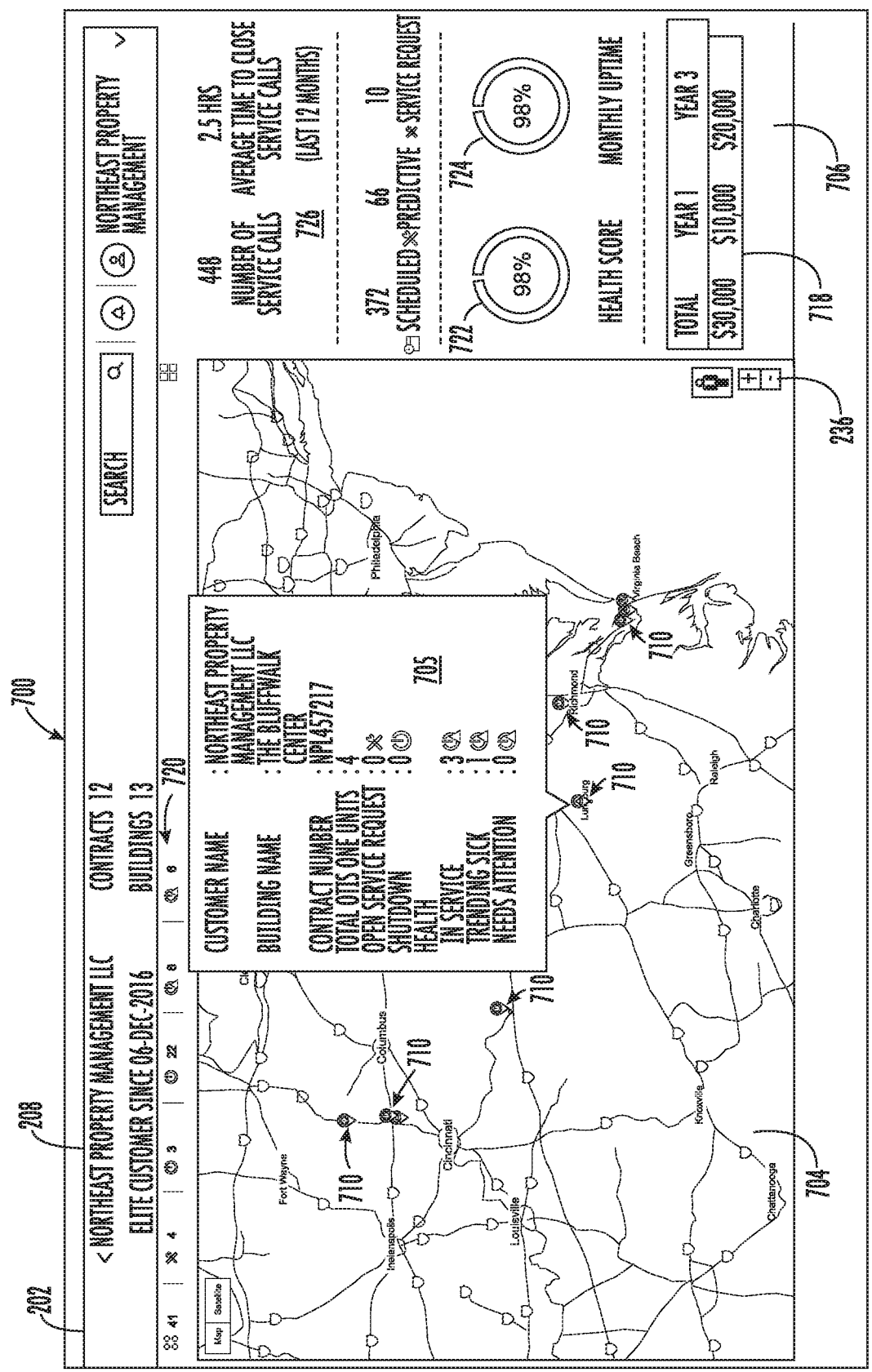
FIG. 7 depicts a graphical user interface in accordance with an embodiment of the present disclosure.

FIG. 7 depicts an example of a graphical user interface 700 of the equipment service graphical interface 56 of FIG. 1 that can be generated by the system 28 for the monitoring access systems 50 of FIG. 1. The graphical user interface 700 includes the same information bar 202, and entity 208 of FIG. 2 after using the map controls 236 to perform a zoom-out operation resulting in a change in map area covered in a map image 704 as compared to the map image 204 of FIG. 2. The map image 704 covers a plurality of entity locations 710, which may be in different towns/states/provinces/countries as graphically depicted as icons or pins. A status data panel 706 of the graphical user interface 700 can include financial information 718, a status summary bar 720, a health score 722, an uptime indicator 724, an activity history 726, and other such information associated with the equipment 10 at the entity locations 710 depicted in the map image 704. In the example of FIG. 7, the map image 704 also depicts a pop-up summary 705 of one or more equipment status details associated with the equipment 10 at a selected instance of an entity location 710. The pop-up summary 705 can include, for example, an entity name, a building name, a contract number, a number of units at the building, a number of open service requests, a number of shutdown units, a number of in-service units, a number of trending sick units, a number of units needing attention and/or other values.

Figure 8:
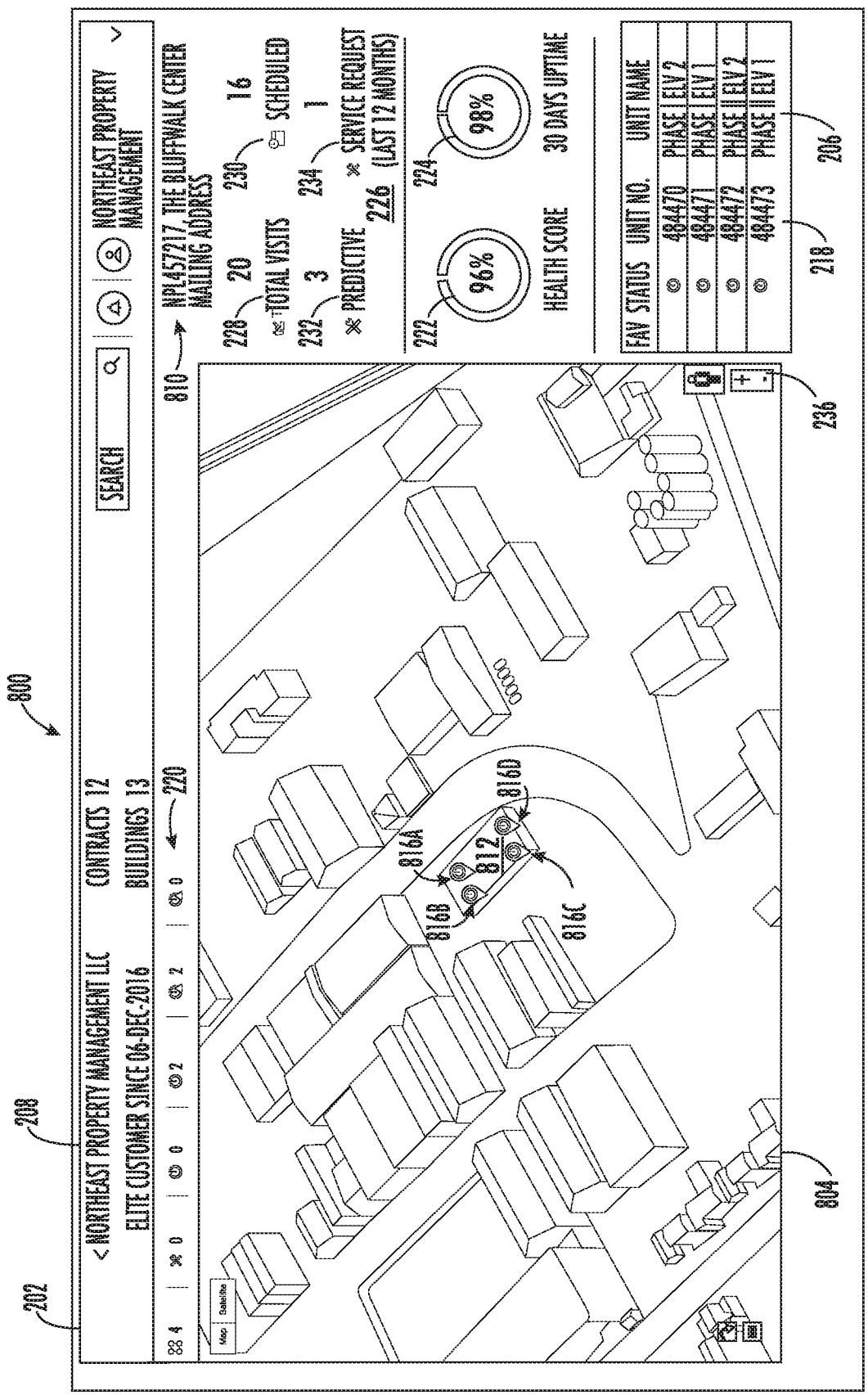
FIG. 8 depicts a graphical user interface in accordance with an embodiment of the present disclosure.

FIG. 8 depicts an example of a graphical user interface 800 of the equipment service graphical interface 56 of FIG. 1 that can be generated by the system 28 for the monitoring access systems 50 of FIG. 1. The graphical user interface 800 includes a similar format as previously described with respect to the graphical user interface 200 of FIG. 2, such as the information bar 202, status data panel 206, entity 208, entity location 810, one or more structures 812 that include equipment 10 of FIG. 1 managed by the entity 208, equipment locations 816A-816D, unit specific information 218, status summary bar 220, health score 222, uptime indicator 224, and activity history 226. A map image 804 of FIG. 8 depicts a different physical location, where the one or more structures 812 are at different geographic locations than the one or more structures 212 of FIG. 2. In the example of FIG. 8, units 25 (FIG. 1) at equipment locations 816A and 816D have a status of "In-Service" and units 25 at equipment locations 816B and 816C have a status of "Trending Sick".

Figure 9:
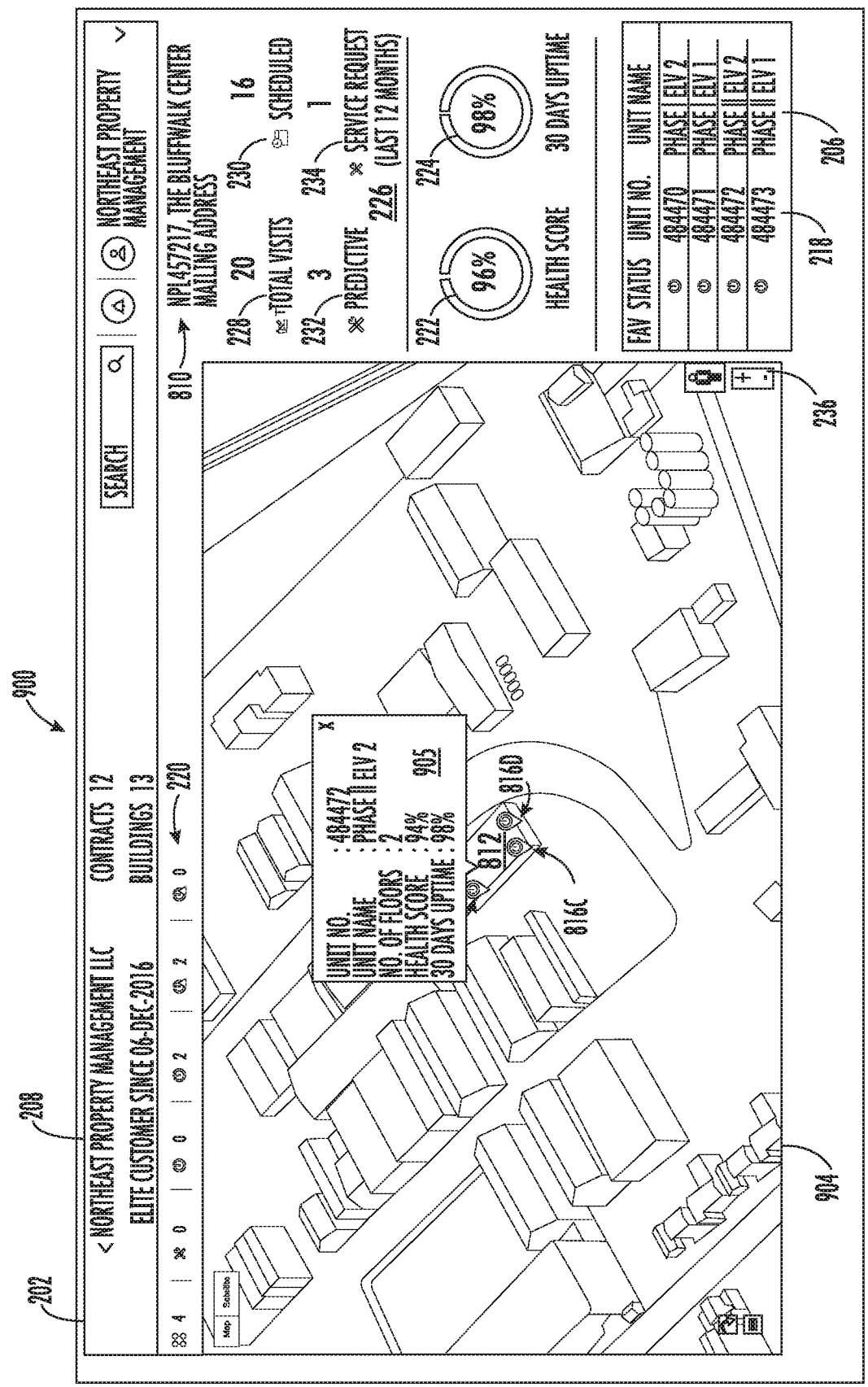
FIG. 9 depicts a graphical user interface in accordance with an embodiment of the present disclosure.

FIG. 9 depicts an example of a graphical user interface 900 of the equipment service graphical interface 56 of FIG. 1 that can be generated by the system 28 for the monitoring access systems 50 of FIG. 1. The graphical user interface 900 includes a similar format as previously described with respect to the graphical user interface 800 of FIG. 8, such as the information bar 202, status data panel 206, entity 208, entity location 810, one or more structures 812 that include equipment 10 of FIG. 1 managed by the entity 208, equipment locations 816A-816D, unit specific information 218, status summary bar 220, health score 222, uptime indicator 224, and activity history 226. A map image 904 the graphical user interface 900 of FIG. 9 also depicts a pop-up summary 905 of one or more equipment status details associated with a specific instance of the equipment 10 at the entity location 810. In the example of FIG. 9, the pop-up summary 905 is associated with the unit 25 (FIG. 1) at equipment location 816C. The pop-up summary 905 can include information such as a unit identifier number, a unit name, a number of floors/landings (e.g., when embodied as an elevator system), a unit-specific health score, a unit-specific uptime, and/or other data. The system 28 can output the pop-up summary 905 based on a detected user input action, such as a hovering action over at least one of the one or more icons on the map image 904.

Figure 10:
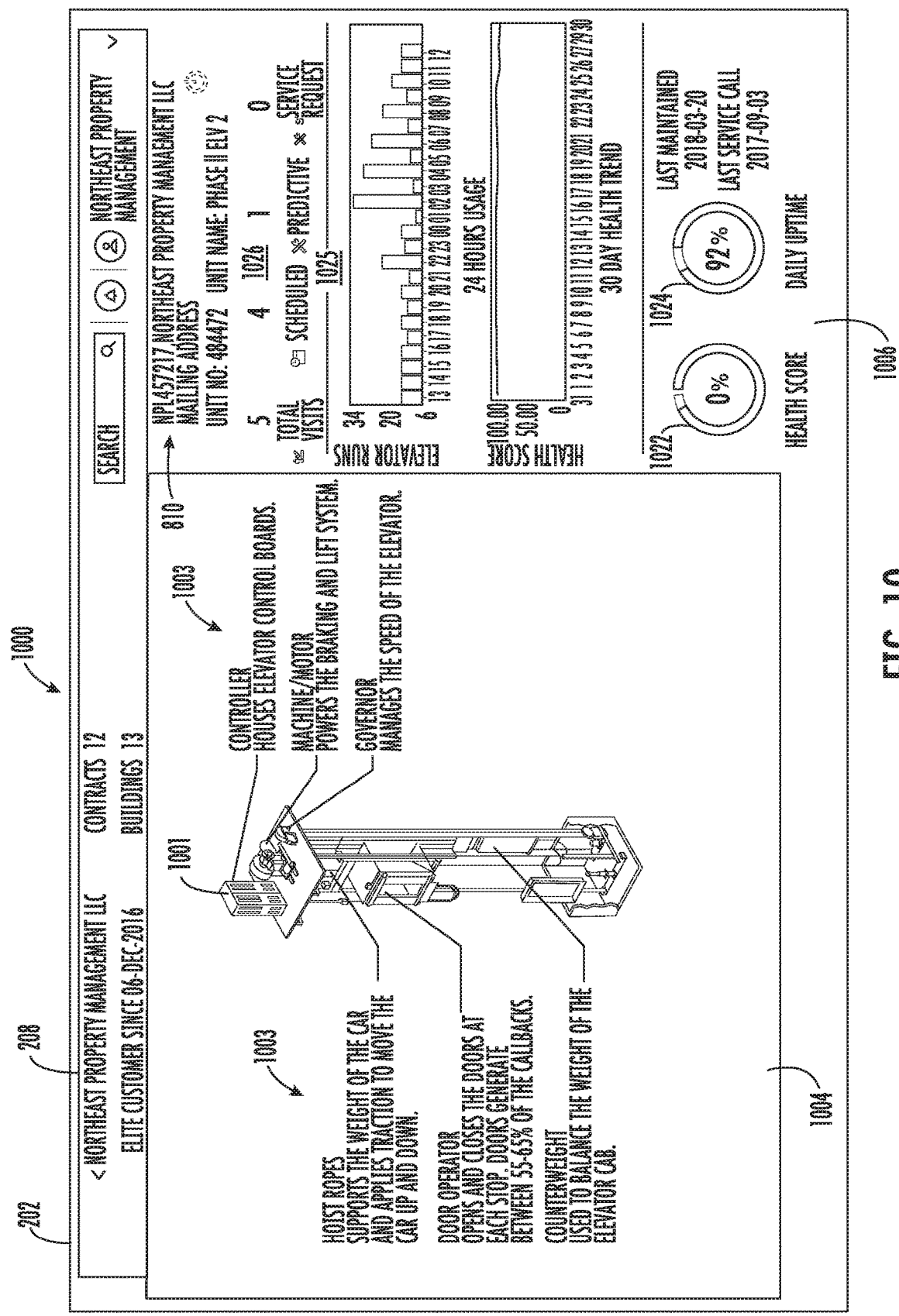
FIG. 10 depicts a graphical user interface in accordance with an embodiment of the present disclosure.

FIG. 10 depicts an example of a graphical user interface 1000 of the equipment service graphical interface 56 of FIG. 1 that can be generated by the system 28 for the monitoring access systems 50 of FIG. 1. The graphical user interface 1000 is an example of updating the graphical user interface 900 of FIG. 9 with a plurality of unit status details based on detecting a unit selection from the plurality of units 25 (FIG. 1). The graphical user interface 1000 includes the same information bar 202, entity 208, and entity location 810 as in FIGS. 8-9; however, other unit-specific details are displayed. For example, an action or gesture associated with the unit 25 at equipment location 816C of FIG. 9, which was summarized by the pop-up summary 905 of FIG. 9, may trigger a more detailed view of the unit 25. For instance, the system 28 may replace the map image 904 on the graphical user interface 900 of FIG. 9 with a schematic view 1004 of a plurality of components 1003 of an elevator system 1001 comprising the unit selection in graphical user interface 1000. Notably the configuration of the elevator system 1001 may differ from the configuration of the elevator system 401 of FIG. 4, for example. Components 1003 can include names, operational summaries, and approximate placement information with respect to a specific model of the elevator system 1001 at the selected location. In the context of elevators, the components 1003 may include hoist ropes, a door operator, a counterweight, a controller, a machine/motor, a governor, and/or other elements. The system 28 may also display the unit status details 1006, such as a health score 1022 and uptime 1024 for the unit selected, an activity history 1026 for the unit selected, and one or more time history plots 1025 for the unit selected.

Figure 11:
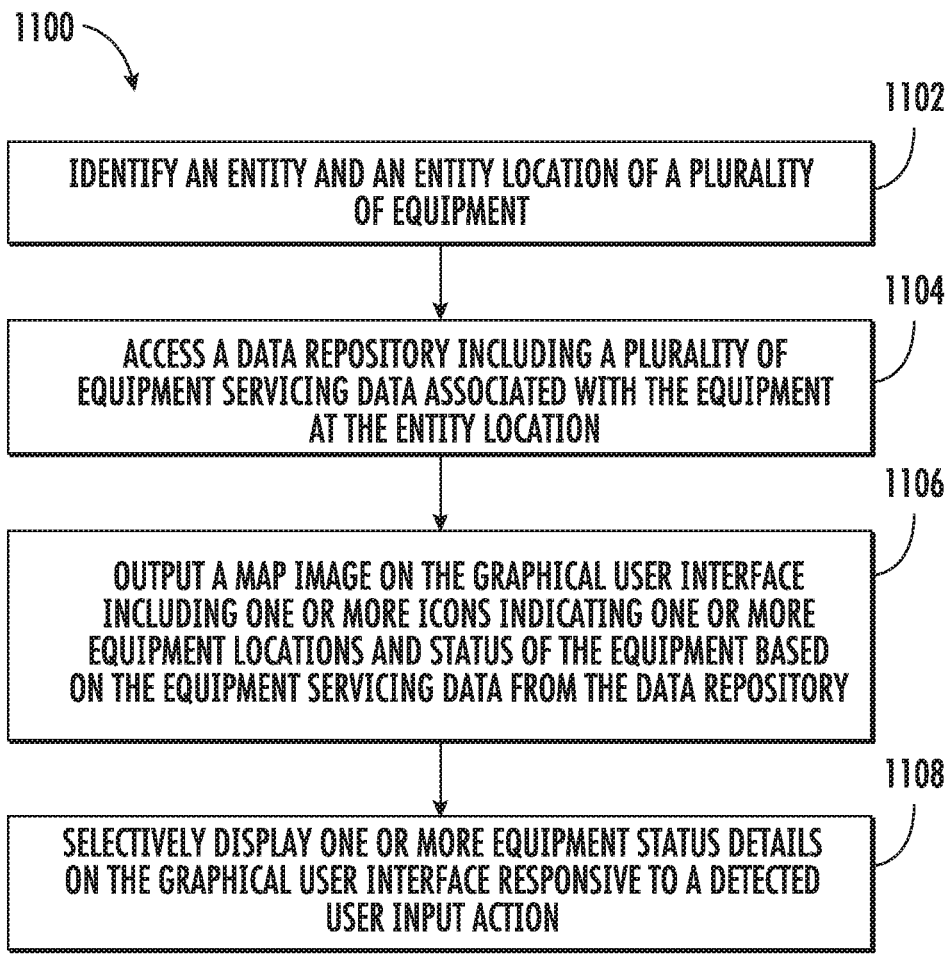
FIG. 11 is a flowchart illustrating a method in accordance with an embodiment of the present disclosure.

FIG. 11 depicts a process 1100 that can be performed by the system 28 of FIG. 1 as shown and described herein and/or by variations thereon. Various aspects of the process 1100 can be carried out using one or more sensors, one or more processors, and/or one or more machines and/or controllers. For example, some aspects of the flow process involve sensors (e.g., accelerometers, speed sensors, position sensors, temperature sensors, strain gauges, torque sensors, cameras, etc.), as described above, in communication with a processor or other control device and transmission of detected information thereto. The process 1100 is described in reference to FIGS. 1-11. The process 1100 can be invoked through one or more monitoring access systems 50 using, for example, the equipment service graphical interface 56 of FIG. 1. For purposes of explanation, the process 1100 is primarily described with respect to the examples of FIGS. 1-3 but is applicable to the examples of FIGS. 4-10 and other embodiments as well.

At block 1102, the system 28 identifies an entity 208 and an entity location 210 of a plurality of equipment 10. At block 1104, the system 28 accesses a data repository 52 including a plurality of equipment servicing data associated with the equipment 10 at the entity location 210.

At block 1106, the system 28 outputs a map image 204 on the graphical user interface 200 including one or more icons indicating one or more equipment locations 216A-216D and status of the equipment 10 based on the equipment servicing data from the data repository 52. One or more display characteristics of the one or more icons can vary based on the status of the equipment 10 indicative of one or more differences in operational conditions of the equipment 10. Differences in display characteristics can include variations in color, shape, flashing, animation, and/or other distinguishing properties.

At block 1108, the system 28 can selectively display one or more equipment status details on the graphical user interface 200 responsive to a detected user input action. The detected user input action can include a hovering action over at least one of the one or more icons. The one or more equipment status details can be associated with a specific instance of the equipment 10 at the entity location depicted on the map image 204, such as displaying the pop-up summary 305.

In some embodiments, the system 28 can output a health score 222 on the graphical user interface 200 that summarizes a plurality of conditions of the equipment 10 at the one or more equipment locations 216A-216D displayed on the graphical user interface 200. The system 28 can output an uptime indicator 224 on the graphical user interface 200 that summarizes a performance history of the equipment 10 at the one or more equipment locations 216A-216D displayed on the graphical user interface 200 for a first predetermined period of time. The system 28 can output an activity history 226 on the graphical user interface 200 that summarizes a total number of visits 228, scheduled visits 230, predictive maintenance events 232, and service requests 234 for the equipment 10 at the one or more equipment locations 216A-216D displayed on the graphical user interface 200 for a second predetermined period of time. The system 28 can output a unit summary (e.g., unit specific information 218 and/or status summary bar 220) on the graphical user interface 200 of a plurality of units 25 of the equipment 10 at the one or more equipment locations 216A-216D displayed on the graphical user interface 200, where each of the units 25 may be an elevator or escalator system.

The system 28 can update the graphical user interface 200 with a plurality of unit status details 406 based on detecting a unit selection from the plurality of units 25. For example, the system 28 can replace the map image 204 on the graphical user interface 200 with a schematic view 404 of a plurality of components 403 of an elevator system 401 comprising the unit selection. The unit status details 406 may include a health score 422 for the unit selected, an uptime for the unit selected, the activity history 426 for the unit selected, and/or one or more time history plots 425 for the unit selected.

In some embodiments, the system 28 can detect a change in a zoom level of the map image 204 on the graphical user interface 200, for example, through the map controls 236. The system 28 can identify a plurality of entity locations 710 of the entity 208 within a geographic area displayed on the map image 704. The system 28 may retrieve the equipment servicing data associated with the equipment 10 at the plurality of entity locations 710 from the data repository 52. The system 28 can update the map image 704 on the graphical user interface 700 with a plurality of icons indicative of the status of the equipment 10 at the plurality of entity locations 710. The system 28 can determine an update to a plurality of summary data associated with the equipment 10 at the plurality of entity locations 710. The system 28 may update one or more values displayed on the graphical user interface 700 with the update to the summary data.

Although described with a particular sequence of steps, it will be understood that the process 1100 of FIG. 11 can be performed in an alternate order and include a greater or fewer number of steps.

The various functions described above may be implemented or supported by a computer program that is formed from computer readable program codes and that is embodied in a computer readable medium. Computer readable program codes may include source codes, object codes, executable codes, and others. Computer readable mediums may be any type of media capable of being accessed by a computer, and may include Read Only Memory (ROM), Random Access Memory (RAM), a hard disk drive, a compact disc (CD), a digital video disc (DVD), or other forms.

Terms used herein such as component, module, system, and the like are intended to refer to a computer-related entity, either hardware, a combination of hardware and software, or software execution. By way of example, a component may be, but is not limited to, a process running on a processor, a processor, an object, an executable, a thread of execution, a program, and/or a computer. It is understood that an application running on a server and the server may be a component. One or more components may reside within a process and/or thread of execution and a component may be localized on one computer and/or distributed between two or more computers.

While the present disclosure is described with reference to exemplary embodiments, it will be understood by those skilled in the art that various changes may be made and equivalents may be substituted without departing from the spirit and scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

What is claimed is:

1. A method comprising:
   identifying an entity and an entity location of a plurality of equipment;
   accessing a data repository comprising a plurality of equipment servicing data associated with the plurality of equipment at the entity location, the equipment servicing data comprising summarized data received from sensors of the plurality of equipment;
   outputting a map image on a graphical user interface comprising one or more icons indicating one or more equipment locations and status of the plurality of equipment based on the plurality of equipment servicing data from the data repository;
   outputting a unit summary of a plurality of units of the plurality of equipment at the one or more equipment locations displayed concurrently with the map image on the graphical user interface, wherein when a viewable area of the map image changes according to user input, the unit summary dynamically updates corresponding to any of the one or more equipment locations being visible in the viewable area of the map image;
   wherein each unit of the plurality of units comprises an elevator system;
   selectively displaying one or more equipment status details on the graphical user interface responsive to a detected user input action;
   updating the graphical user interface with a plurality of unit status details based on detecting a unit selection from the plurality of units; and
   replacing the map image on the graphical user interface with a schematic view of a plurality of components of the elevator system comprising the unit selection with an operational summary of the plurality of components associated with the plurality of equipment servicing data and positioning information relative to the plurality of components of the elevator system in the schematic view, the information corresponding to a specific model of the elevator system based on the unit selection, displayed in combination with two or more of: the entity location, a unit health score, a unit uptime, and a unit activity history of the unit selection.

2. The method of claim 1, wherein the detected user input action comprises a hovering action over at least one of the one or more icons, and the one or more equipment status details are associated with a specific instance of the plurality of equipment at the entity location depicted on the map image.

3. The method of claim 1, wherein one or more display characteristics of the one or more icons vary based on the status of the plurality of equipment indicative of one or more differences in operational conditions of the plurality of equipment.

4. The method of claim 1, further comprising:
outputting a health score on the graphical user interface that summarizes a plurality of conditions of the plurality of equipment at the one or more equipment locations displayed on the graphical user interface.

5. The method of claim 4, further comprising:
outputting an uptime indicator on the graphical user interface that summarizes a performance history of the plurality of equipment at the one or more equipment locations displayed on the graphical user interface for a first predetermined period of time.

6. The method of claim 5, further comprising:
outputting an activity history on the graphical user interface that summarizes a total number of visits, scheduled visits, predictive maintenance events, and service requests for the plurality of equipment at the one or more equipment locations displayed on the graphical user interface for a second predetermined period of time.

7. The method of claim 1, wherein the plurality of unit status details comprises two or more time history plots with different time scales for the unit selection.

8. The method of claim 1, further comprising:
detecting a change in a zoom level of the map image on the graphical user interface;
identifying a plurality of entity locations of the entity within a geographic area displayed on the map image;
retrieving the plurality of equipment servicing data associated with the plurality of equipment at the plurality of entity locations from the data repository;
updating the map image on the graphical user interface with a plurality of icons indicative of the status of the plurality of equipment at the plurality of entity locations;
determining an update to a plurality of summary data associated with the plurality of equipment at the plurality of entity locations; and
updating one or more values displayed on the graphical user interface with the update to the plurality of summary data.

9. A system comprising: a processing system; and
a memory system having a plurality of instructions stored thereon that, when executed by the processing system, cause the system to:
identify an entity and an entity location of a plurality of equipment;
access a data repository comprising a plurality of equipment servicing data associated with the plurality of equipment at the entity location, the equipment servicing data comprising summarized data received from sensors of the plurality of equipment;
output a map image on a graphical user interface comprising one or more icons indicating one or more equipment locations and status of the plurality of equipment based on the plurality of equipment servicing data from the data repository;
outputting a unit summary of a plurality of units of the plurality of equipment at the one or more equipment locations displayed concurrently with the map image on the graphical user interface, wherein when a viewable area of the map image changes according to user input, the unit summary dynamically updates corresponding to any of the one or more equipment locations being visible in the viewable area of the map image;
wherein each unit of the plurality of units comprises an elevator system;
selectively display one or more equipment status details on the graphical user interface responsive to a detected user input action;
updating the graphical user interface with a plurality of unit status details based on detecting a unit selection from the plurality of units; and
replacing the map image on the graphical user interface with a schematic view of a plurality of components of the elevator system comprising the unit selection with an operational summary of the plurality of components associated with the plurality of equipment servicing data and positioning information relative to the plurality of components of the elevator system in the schematic view, the information corresponding to a specific model of the elevator system based on the unit selection, displayed in combination with two or more of: the entity location, a unit health score, a unit uptime, and a unit activity history of the unit selection.

10. The system of claim 9, wherein the detected user input action comprises a hovering action over at least one of the one or more icons, and the one or more equipment status details are associated with a specific instance of the plurality of equipment at the entity location depicted on the map image.

11. The system of claim 9, wherein one or more display characteristics of the one or more icons vary based on the status of the plurality of equipment indicative of one or more differences in operational conditions of the plurality of equipment.

12. The system of claim 9, wherein the instructions when executed by the processing system cause the system to:
output a health score on the graphical user interface that summarizes a plurality of conditions of the plurality of equipment at the one or more equipment locations displayed on the graphical user interface.

13. The system of claim 12, wherein the instructions when executed by the processing system cause the system to:
output an uptime indicator on the graphical user interface that summarizes a performance history of the plurality of equipment at the one or more equipment locations displayed on the graphical user interface for a first predetermined period of time.

14. The system of claim 13, wherein the instructions when executed by the processing system cause the system to:
output an activity history on the graphical user interface that summarizes a total number of visits, scheduled visits, predictive maintenance events, and service requests for the plurality of equipment at the one or more equipment locations displayed on the graphical user interface for a second predetermined period of time.

15. The system of claim 9, wherein the plurality of unit status details comprises two or more time history plots with different time scales for the unit selection.

16. The system of claim 9, wherein the instructions when executed by the processing system cause the system to:

detect a change in a zoom level of the map image on the graphical user interface;
identify a plurality of entity locations of the entity within a geographic area displayed on the map image;
retrieve the plurality of equipment servicing data associated with the plurality of equipment at the plurality of entity locations from the data repository;
update the map image on the graphical user interface with a plurality of icons indicative of the status of the plurality of equipment at the plurality of entity locations;
determine an update to a plurality of summary data associated with the plurality of equipment at the plurality of entity locations; and
update one or more values displayed on the graphical user interface with the update to the plurality of summary data.

17. The method of claim 1, further comprising:
tracking a number of predictive visits made to the entity location based on sensor data indicating a non-failed component needing maintenance in a predetermined period of time; and
outputting the number of predictive visits in the unit activity history.

18. The system of claim 9, wherein the instructions when executed by the processing system cause the system to:
track a number of predictive visits made to the entity location based on sensor data indicating a non-failed component needing maintenance in a predetermined period of time; and
output the number of predictive visits in the unit activity history.

\* \* \* \* \*